United States Patent [19]

Krupa et al.

[11] 4,318,045
[45] Mar. 2, 1982

[54] SYMMETRICAL WAVEFORM SIGNAL GENERATOR HAVING COHERENT FREQUENCY SHIFT CAPABILITY

[75] Inventors: John E. Krupa, Moorestown; Preston L. Magness, Cinnaminson; Thomas J. Brady, Haddonfield, all of N.J.

[73] Assignee: RCA Corporation, New York, N.Y.

[21] Appl. No.: 138,867

[22] Filed: Apr. 10, 1980

[51] Int. Cl.³ .................... H03K 3/84; H03K 29/00; H03B 19/00
[52] U.S. Cl. ........................... 328/18; 328/14
[58] Field of Search ................. 328/18, 14, 15, 16

[56] References Cited

U.S. PATENT DOCUMENTS 3,702,441  11/1972  Thrower ............................. 328/14
3,982,199   9/1976  Green ................................ 328/14
4,025,865   5/1977  Munday ............................. 328/18

Primary Examiner—Alfred E. Smith
Assistant Examiner—T. N. Grigsby
Attorney, Agent, or Firm—Samuel Cohen; Robert L. Troike; Christopher L. Maginniss

[57] ABSTRACT

An apparatus for generating a signal having symmetrical waveform of frequency selectable according to a plurality of input signals. The frequency of the signal changes rapidly in response to changes in the input signals, and frequency changes occur in a coherent manner, with no perturbation of the output signal. A high speed clocking signal and the signals generated by its successive divisions are logically combined to produce a plurality of signals which are filtered to produce substantially symmetrical waveform signals which are maintained in periodic phase coherence. Under control of frequency select input signals, a selected one of the substantially symmetrical waveform signals is gated into a divider which provides a symmetrical waveform output signal having the selected frequency.

7 Claims, 12 Drawing Figures

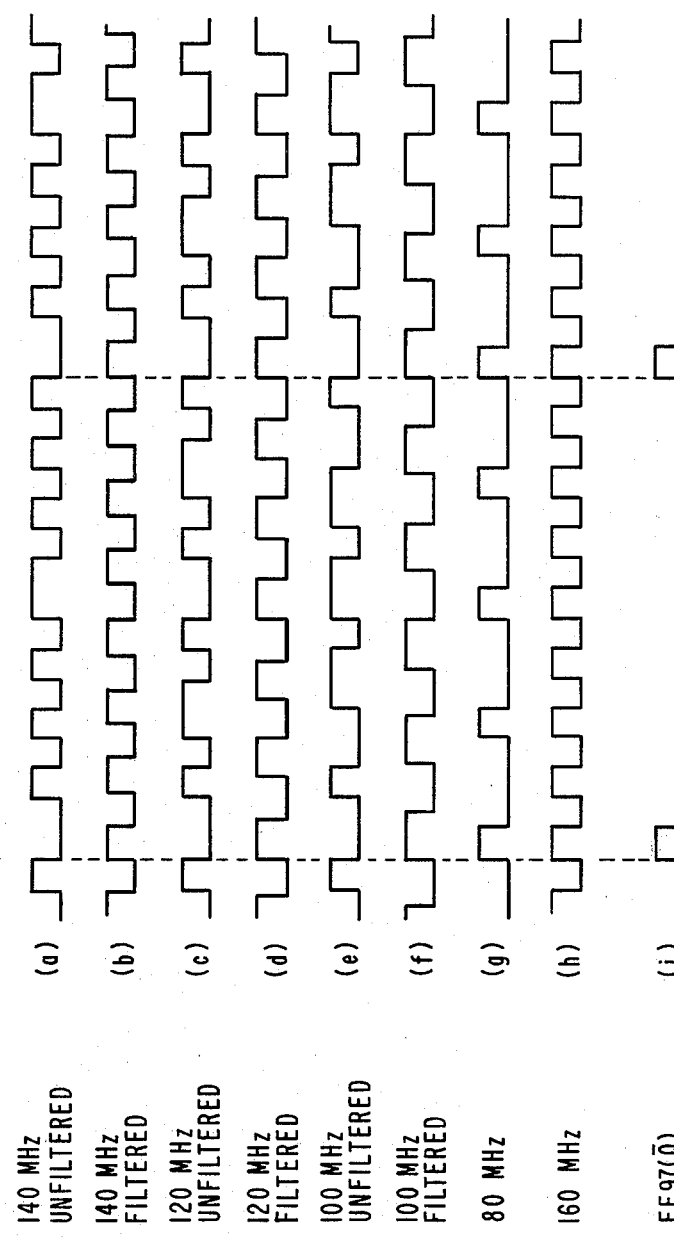

SYMMETRICAL WAVEFORM SIGNAL GENERATOR HAVING COHERENT FREQUENCY SHIFT CAPABILITY

The Government has rights in this invention pursuant to Contract No. N00017-70-C-2403 awarded by the Department of the Navy.

This invention relates to a generator of symmetrical waveform signals and more particularly to a selectable frequency signal generator for producing symmetrical waveform signals of selectable frequencies in which in response to external stimuli the shifting from one frequency to another occurs with little or no perturbation of the signal.

In modern radar and communications systems it is often necessary to shift the frequency of the RF carrier. The frequency shift must be accomplished rapidly with little or no perturbation of the carrier signal. One method of achieving this end, using the single sideband generator shown in FIG. 1, is well known in the art. The theory of operation is based on the principle that if two sinusoidal signals of different frequencies are multiplied and properly added or subtracted, the resulting signal will have a frequency which is either the sum or the difference of the two input signal frequencies. This may be expressed mathematically as:

$$\cos(A \pm B) = \cos A \cos B \mp \sin A \sin B$$

Thus by changing the sign of the (sin A sin B) term the upper or lower sideband, cos (A+B) or cos (A−B), will be generated.

This system has many undesirable features. The switching transients are large and the purity of the upper and lower sideband signals is relatively poor. In addition, if more than two frequencies are required on the output signal, the switching problems become very complex.

A second approach to coherent frequency switching is shown in FIG. 2. In this approach, a high speed switch selects any of the desired input frequency signals. These signals are coherently generated in an external chassis. The switching is arranged to occur at the zero crossings of the RF signals. This system has provided satisfactory results, but the generation of the RF signals in a coherent manner is very costly. In addition, it is difficult to maintain the required phase relationships among the externally generated RF signals over long periods of time.

In accordance with one embodiment of the present invention an apparatus for providing in response to a clocking signal one of a plurality of signals having symmetrical waveform at predetermined frequencies selectable according to frequency select input signals, includes counter means responsive to the clocking signal for producing a plurality of counter output signals. Each counter output signal is an integral divisor of the clocking signal. The apparatus further includes combinatorial means coupled to the counter means for producing output signals which frequencies are an integral multiple of the selectable predetermined frequencies; separate filters tuned to pass those signals having frequencies which are the integral multiple of the predetermined frequencies, and tuned also to provide phase alignment of each filtered output signal at periodic instances of time; the combinatorial means including means for producing timing signals related to the periodic instances of phase alignment; gating means coupled to the filtered output signals for gating one of those signals in response to a frequency select enable signal; and means for dividing the frequency of the gated signal by the integral multiple of the predetermined frequency so as to produce a symmetrical waveform signal at the predetermined frequency. Switch means are provided wherein a selected one of a plurality of frequency select input signals responds to a combination of the timing signals to produce a selected one of a plurality of frequency select enable signals. Changes in the frequency select enable signals occur only at instances of phase coherence of the filtered output signals.

In the drawing:

FIG. 12 is a set of timing diagrams useful in explaining the circuit of FIG. 9.

Figure 1:
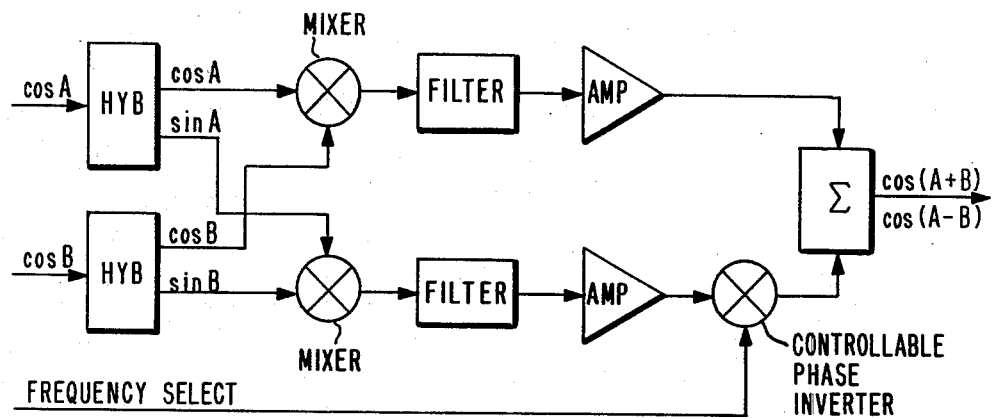
FIG. 1 is a block diagram of a single sideband generator according to the prior art.

Referring to FIG. 1 there is illustrated one method of shifting the frequency of an RF carrier with little or no perturbation of the carrier signal according to the prior art. The theory of operation of this method is based on the principle that if two sinusoidal signals of different frequencies are multiplied and properly added or subtracted, the resulting signal will have a frequency which is either the sum or the difference of the two input signal frequencies. This may be expressed mathematically as:

$$\cos(A \pm B) = \cos A \cos B \mp \sin A \sin B$$

Thus by changing the sign of the (sin A sin B) term the upper or lower sideband, cos (A+B) or cos (A−B), will be generated.

Two input signals (A and B) are applied to the system; the frequencies of the two signals are related in that one is an integral multiple of the other, and they have the same phase relationship. As an example, the two frequencies may be 45 MHz and 5 MHz. Each signal is applied to a corresponding hybrid circuit, each of which generates two output signals. One hybrid output signal retains the frequency and phase of the input signal; the other is at the same frequency but 90° out of phase. The output signals of the two hybrids which are in phase with their input signals (cos A and cos B as indicated in FIG. 1) are mixed and the mixer output is applied to a filter. The filter output signal is amplified and applied to a summer ($\Sigma$). The output signals of the two hybrids which are 90° out of phase with their input signals (sin A and sin B indicated in FIG. 1) are mixed and the mixer output is applied to a filter, which filter output signal is then amplified and applied to a controllable phase inverter which either passes it through or inverts it, according to the state of a control input signal to the controllable phase inverter. The output signal, either inverted or non-inverted, is then applied to the summer ($\Sigma$), and the output of the summer is a signal having one of two frequencies. For one state of the control input signal, the output signal will be the sum of the two input signal frequencies, or 50 MHz, the upper sideband. For the other state of the control input signal, the output signal will be the difference between the two input signal frequencies, or 40 MHz, the lower sideband.

To ensure that the frequency shift occurs coherently, with no perturbation at the output, the control input signal must change state only when the input signals are in phase alignment. This will always occur, for example, when the input signal having the lower frequency is at a zero-crossing.

As mentioned previously, this system has many undesirable features. The switching transients are large and the purity of the upper and lower sideband signals is relatively poor. In addition, if more than two frequencies are required on the output signal, the switching problems become very complex.

Figure 2:
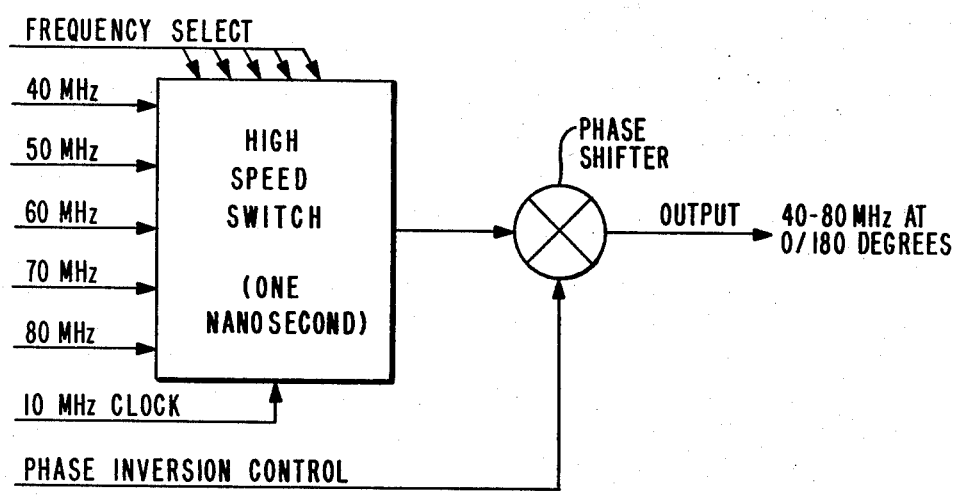
FIG. 2 is a block diagram of a high speed switching arrangement for coherently switching from among a plurality of input signals having different frequencies, according to the prior art.

A second approach to coherent frequency switching is shown in FIG. 2. In this approach, a high speed switch selects any one of the desired input frequency signals. These signals are coherently generated in an external chassis. The switching is arranged to occur at the zero crossings of the RF signals. The switching must be done rapidly (on the order of one nanosecond, for example) so that little or no switching transients are produced. For satisfactory operation, all of the RF signals must be at zero crossings during the switching, and the direction of the selected signal must be the same as the present generator output signal; this requires a 180° phase shifter.

This system has provided satisfactory results, but the generation of the RF signals in a coherent manner is very costly. In addition, it is difficult to maintain the required phase relationships among the externally generated RF signals over long periods of time.

Figure 3:
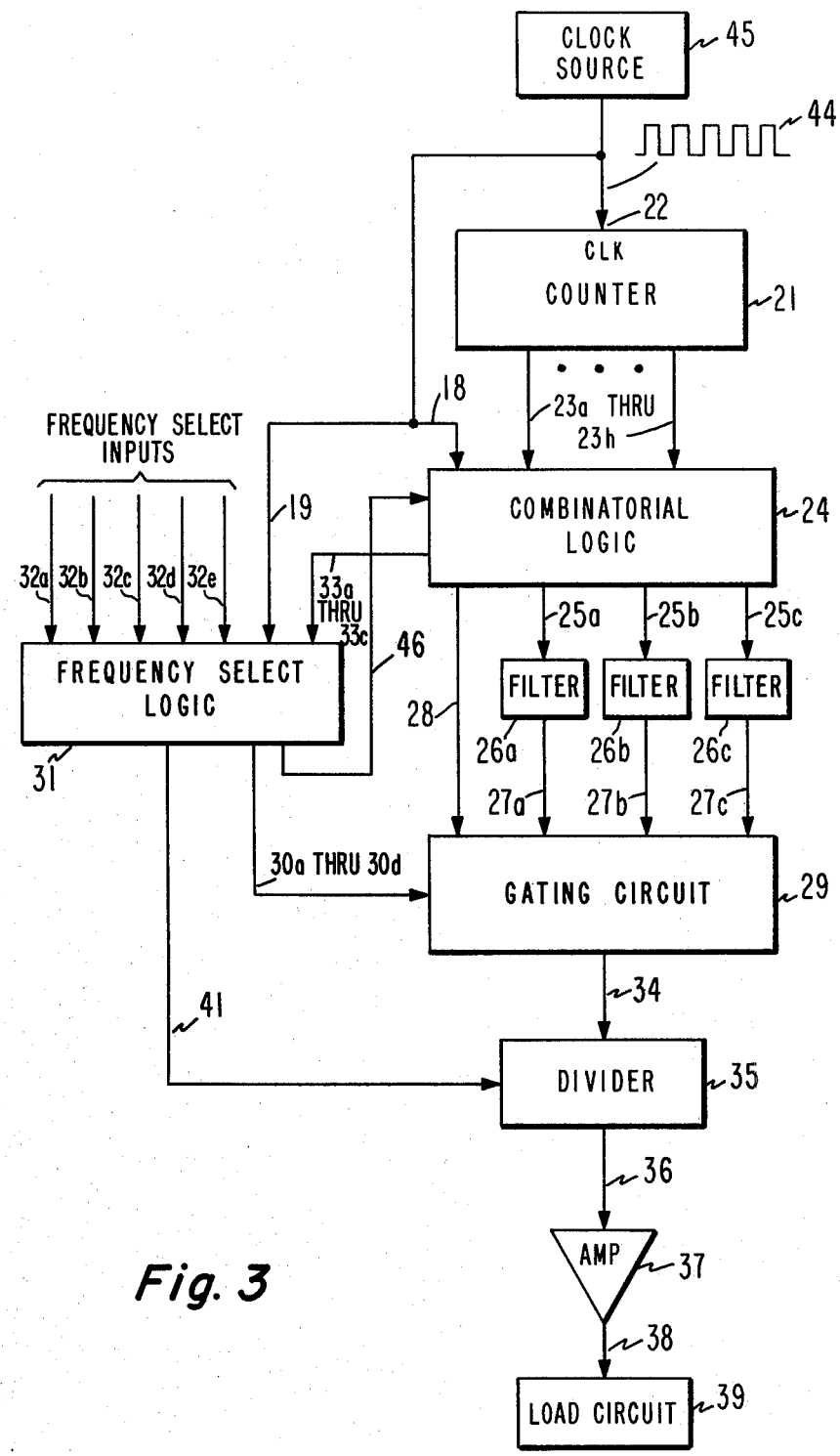
FIG. 3 is a basic block diagram of a preferred embodiment of the instant invention.

Referring to FIG. 3 a block diagram is shown of the preferred embodiment of applicants' invention for generating, for example, 40 MHz, 50 MHz, 60 MHz, 70 MHz, and 80 MHz frequency signals, and the coherent switching of these signals to provide an output signal which responds rapidly to an external stimulus requiring a change of frequency, with little or no perturbation of the signal. A clock source 45 supplies a signal 44 to a counter 21 at its CLK input 22. The counter 21 is a four-stage ripple-carry counter, well known in the art. A plurality of the counter input signal are applied via separate leads 23a through 23h (referred collectively as leads 23) to a grouping of logic elements referred to as combinatorial logic 24. At combinatorial logic 24 the signal from the clock source 45 on lead 18, the counter output signals on leads 23, and a signal from a frequency select logic 31 on lead 46 are combined in such a manner as to produce output signals on separate leads 25a through 25c (referred collectively as leads 25) having waveforms which are not necessarily symmetrical and are twice the frequency of the desired waveform frequencies. Those combinatorial logic output signals which are not symmetrical are applied via leads 25 to separate analog filters 26a through 26c which produce filtered output signals at separate leads 27a through 27c (referred collectively as leads 27) having substantially symmetrical waveforms. These filtered output signals on leads 27 as well as the symmetrical waveform signals on lead 28 produced within the combinatorial logic 24, are applied as input signals to a gating circuit 29. The frequency select logic 31 provides the control input signals on separate leads 30a through 30d (referred collectively as leads 30) to the gating circuit 29. Five frequency select signals are applied via leads 32a through 32e (referred collectively as leads 32) to the frequency select logic 31; each one of these frequency select signals represents one of the desired output frequencies and, when present, causes a corresponding input from among signals on leads 27 and 28 to the gating circuit 29 to be gated through to divider 35. The frequency select logic 31 receives timing pulses from combinatorial logic 24 on three combinatorial logic output leads 33a through 33c (referred collectively as leads 33) and from the clock source 45 via lead 19 which ensure that frequency select changes will occur only at times when the input signals on leads 27 and 28 to the gating circuit 29 are in phase alignment. The signal at the output of the gating circuit 29 on lead 34 is applied to a divider 35 which, under the control of the signal on lead 41 from the frequency select logic 31, divides the enabled signal in half and improves the symmetry of the waveform, producing a signal of symmetrical waveform having the desired frequency on output lead 36. In the applicant's embodiment this signal at lead 36 is applied to amplifier 37 which output at lead 38 has a symmetrical waveform at the selected frequency. The amplifier 37 provides power gain and a linear termination for any reflected energy from load circuit 39, which is typically a transmission line.

For purposes of illustration, the logic elements which will be depicted and described in the discussion of this embodiment will be like those in the family of MECL 10,000 series and MECL III MC1600 series digital logic made by Motorola Semiconductor Products, Inc., Phoenix, Arizona. More specifically, the logic elements will be similar to the MC10124 Quad MTTL to MECL Translator, the MC1690 UHF Prescaler Type D Flip-Flop, and the MC162 Quad 2-input NOR Gate. The applicant has chosen an Emitter Coupled Logic (ECL) family because of its ability to operate at high frequencies, but the invention is applicable to any family of logic circuitry operating at all frequencies.

Figure 4:
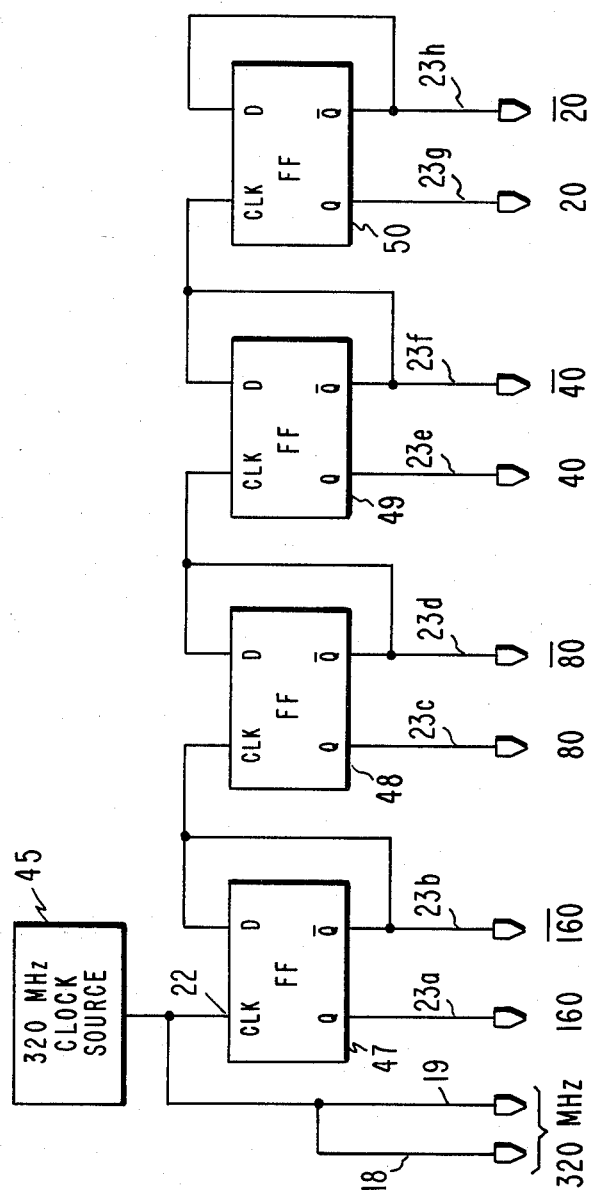
FIG. 4 is a logic diagram representation of the counter employed in the embodiment of FIG. 3.
Figure 5:
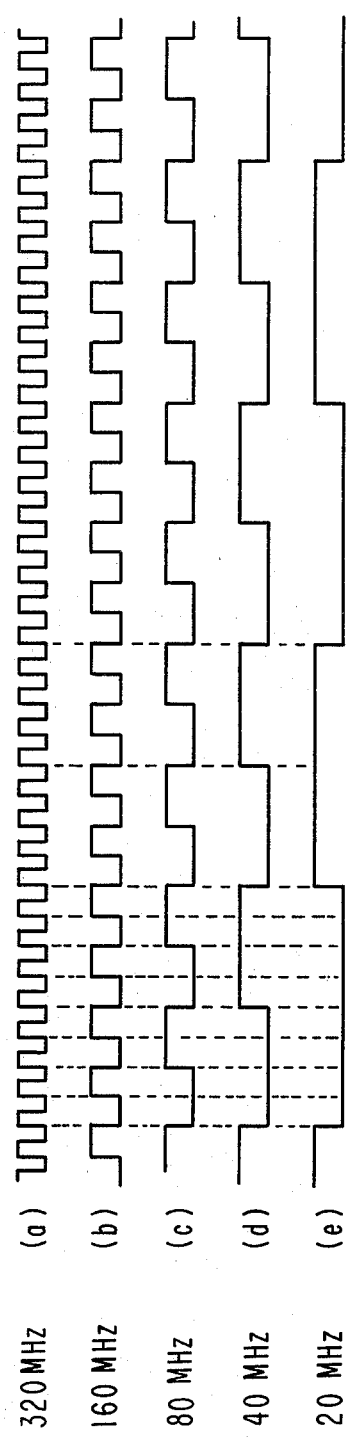
FIG. 5 is a set of timing diagrams useful in explaining the counter of FIG. 4.

FIG. 4 depicts a binary ripple-carry counter, comprising four D-type flip-flops 47, 48, 49, and 50, and well known in the art. The Q and $\overline{Q}$ outputs of the flip-flops provide successive divisions of the signal from clock source 45, which is applied to the CLK input 22 of flip-flop 47. Applicant has selected a 320 MHz clock source. The flip-flops 47 through 50 are of a type similar to a MECL III 1690 type, for which the Q and $\overline{Q}$ outputs change state only on the rising edge of the clock input. On that rising edge, the state of the D input is transferred to the Q output, and the complementary value is simultaneously transferred to the $\overline{Q}$ output. In a ripple-carry counter of this type, the $\overline{Q}$ output of each flip-flop is connected to the D input of that flip-flop, causing the flip-flop to change state on every rising edge of the clock input. The relation between the clock source and the Q output of flip-flop 47 is seen in waveforms (a) and (b) of FIG. 5. The frequency of the square wave at the Q output 23a of flip-flop 47 is 160 MHz. Each $\overline{Q}$ output is applied to the CLK input of the subsequent flip-flop of the counter. A flip-flop's Q and $\overline{Q}$ outputs change state as the $\overline{Q}$ output of the previous flip-flop goes from a low level to a high level, i.e., when the flip-flop is made to reset. Flip-flop 48 is clocked by a 160 MHz signal, and its Q and $\overline{Q}$ outputs are 80 MHz. Flip-flop 49 is clocked by 80 MHz and its Q and $\overline{Q}$ outputs are 40 MHz. Similarly, flip-flop 50 is clocked by 40 MHz and its output is 20 MHz. The relation between the 320 MHz clock source and the outputs of the four flip-flops 47 through 50 may be seen in waveforms (a) through (e) of FIG. 5. In the description and figures that follow, the signal at the $\overline{Q}$ output of flip-flop 47 on lead 23a will be designated as 160 and the signal at the $\overline{Q}$ output of flip-flop 47 on lead 23b will be designated as $\overline{160}$. Similarly, the signals at the Q and $\overline{Q}$ outputs of flip-flops 48 on leads 23c and 23d, respectively, will be 80 and $\overline{80}$, respectively; the signals at the Q and $\overline{Q}$ outputs of flip-flop 49 on leads 23e and 23f, respectivey, will be 40 and $\overline{40}$, respectively; and the signals at the Q and $\overline{Q}$ outputs of flip-flop 50 on leads 23g and 23h, respectively, will be 20 and $\overline{20}$, respectively.

Figure 6:
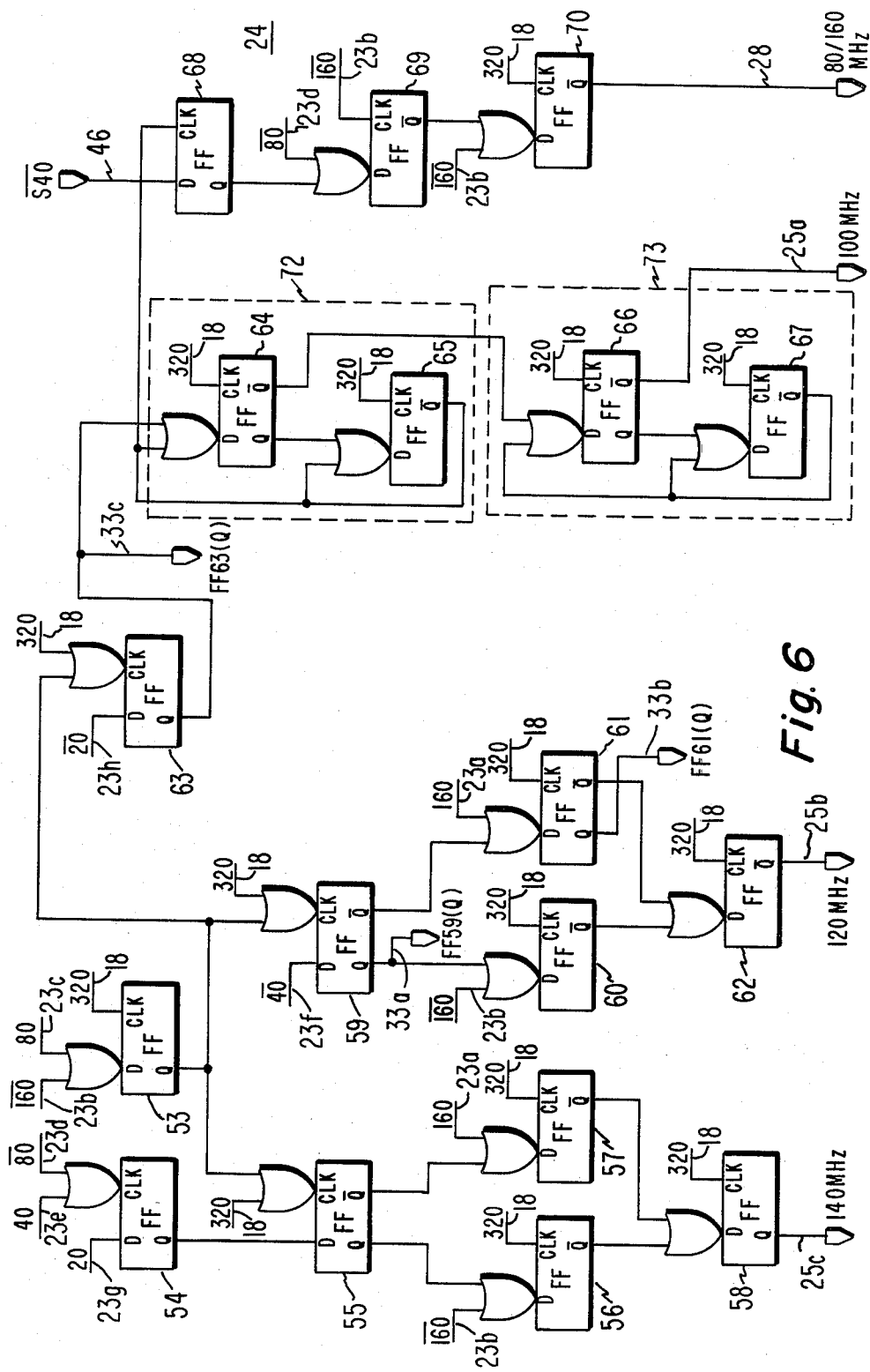
FIG. 6 is a logic diagram representation of the combinatorial logic employed in the embodiment of FIG. 3.

The combinatorial logic 24, referred to in FIG. 3, is illustrated in FIG. 6 and consists of several distinct logic circuits. The configuration of each of these circuits determines the frequency of the signal to be generated. The object of these circuits is to modify the incoming signals on leads 23a through 23h from the counter 21 into signals having frequencies which are twice that of the five desired output frequencies of 40 MHz, 50 MHz, 60 MHz, 70 MHz, and 80 MHz; that is, the output signals on leads 25a through 25c and 28 of the combinatorial logic 24 will have frequencies of 80 MHz, 100 MHz, 120 MHz 140 MHz, and 160 MHz.

The 140 MHz signal is obtained by combining the 160 MHz and 20 MHz output signals on leads 23 from counter 21 in an exclusive-OR function. Similarly, the 120 MHz signal is obtained by exclusive-ORing the 160 MHz and 40 MHz output signals on leads 23 from counter 21. The 100 MHz signal is obtained by a logical combination of outputs from several leads 23 from counter 21, involving two divide-by-three circuits. The 160 MHz and 80 MHz signals are carried on a single signal lead 28 which is enabled to the proper frequency by the frequency select inputs 32 and the frequency select output signal on lead 46. A detailed discussion of each of the combinatorial logic circuits will follow in the subsequent paragraphs.

FIG. 6 is a logic diagram of the combinatorial logic circuitry. The logic 24 includes flip-flops 53 through 70 which are all of the type similar to MECL III MC1690, described above, and which transfer the logic state of the signal at the D input to the Q output on the rising edge of the signal at the CLK input. The 140 MHz signal generator comprises flip-flops 54, 55, 56, 57 and 58; the 120 MHz signal generator comprises flip-flops 59, 60, 61 and 62; the 100 MHz signal generator comprises flip-flops 63, 64, 65, 66 and 67; and the 160/80 MHz signal generator comprises flip-flops 68, 69 and 70. Additionally, the signal on the Q output of flip-flop 53 is used by three of the signal generators.

Figure 7:
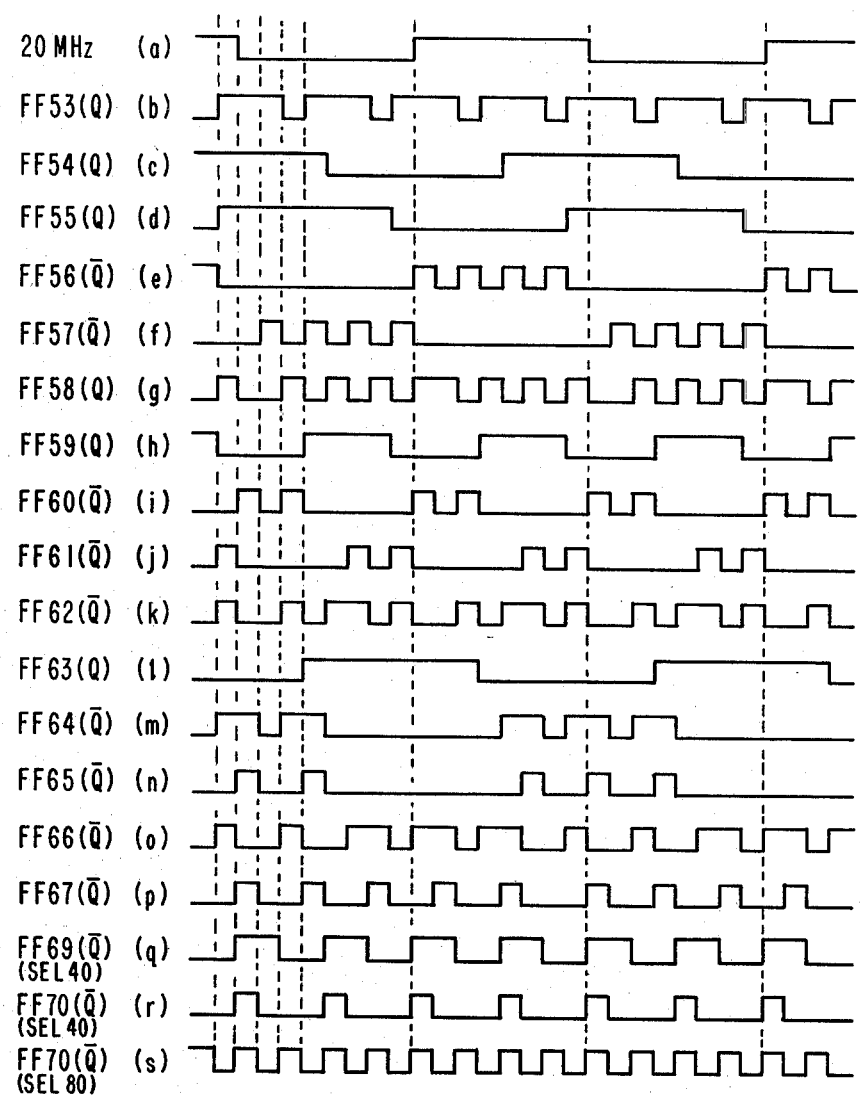
FIG. 7 is a set of timing diagrams useful in explaining the combinatorial logic of FIG. 6.

FIG. 7 is a timing diagram of the waveforms of significance within the combinatorial logic circuitry. Waveform (a) of FIG. 7, noted as 20 MHz, represents the counter output signal at the Q output of flip-flop 50 (in FIG. 4), and its inclusion in this figure provides a reference for the balance of the waveforms, which are all in relative phase alignment. Flip-flop 53 has, as its D input signal, the ORed combination of counter output signals $\overline{160}$ and 80, on leads 23b and 23c, respectively, and the flip-flop 53 is clocked by the 320 MHz clock signal applied via lead 18. Waveform (b) of FIG. 7, noted as FF53(Q), represents the signal on the Q output of flip-flop 53 which is used, as previously mentioned, by the 140, 120 and 100 MHz generators.

The 140 MHz signal is obtained by what is essentially the exclusive-ORing of the 160 MHz and 20 MHz output signals of counter 21. However, for purposes of speed and symmetry of the waveform, the applicant has effected this function using flip-flops. As may be seen in FIG. 6, flip-flop 54 has, as its D input signal, the 20 MHz counter output signal on lead 23g from counter 21, and it is clocked by the ORed combination of counter output signals $\overline{80}$ on lead 23d and 40 on lead 23e, resulting in a signal at its Q output which waveform is depicted as waveform (c) of FIG. 7 and noted as FF54(Q). This signal is applied to the D input of flip-flop 55, which is clocked by the ORed combination of signal FF53(Q), waveform (b), and the 320 MHz clock signal applied via lead 18. The signal on the Q output of flip-flop 55, noted as FF55(Q) in waveform (d) of FIG. 7, if ORed with counter output signal $\overline{160}$ on lead 23b as the D input to flip-flop 56. The signal on the $\overline{Q}$ output of flip-flop 55 is ORed with counter output 160 on lead 23a as the D input to flip-flop 57. Both flip-flops 56 and 57 are clocked by the 320 MHz clock signal via lead 18 and the signals on their $\overline{Q}$ outputs, which waveforms are depicted as waveforms (e) and (f) of FIG. 7, respectively, and noted as FF56($\overline{Q}$) and FF57($\overline{Q}$), respectively, are ORed and applied to the D input of flip-flop 58, which is also clocked by the 320 MHz clock signal via lead 18. The Q output of flip-flop 58 which waveform is shown as waveform (g) of FIG. 7 and noted as FF58(Q), is the 140 MHz output signal of the combinatorial logic 24 and appears on lead 25c.

The 120 MHz signal is obtained by what is essentially the exclusive ORing of the 160 MHz and 40 MHz output signals of counter 21. Again, for purposes of speed and symmetry, the applicant has chosen to implement this function using flip-flops. Referring again to FIG. 6, the counter output signal 40 on lead 23f is applied to the D input of flip-flop 59 and the CLK input signal to that flip-flop 59 is the ORed combination of the Q output signal of flip-flop 53 and the 320 MHz clock source applied via lead 18. The waveform of the signal at the Q output of flip-flop 59 is shown as waveform (h) of FIG. 7 and noted as the FF59(Q). This signal is ORed with counter output signal $\overline{160}$ on lead 23b as the D input to flip-flop 60. The signal on the $\overline{Q}$ output of flip-flop 59 is ORed with counter output signal 160 on lead 23a as the D input to flip-flop 61. Both flip-flops 60 and 61 are clocked by 320 MHz at lead 18 and the signals on their $\overline{Q}$ outputs which waveforms are depicted as waveforms (i) and (j) of FIG. 7, respectively, and noted as FF60($\overline{Q}$) and FF61($\overline{Q}$), respectively, are applied to the D input of flip-flop 62, which is also clocked by 320 MHz via lead 18. The signal at the Q output of flip-flop 62, which waveform is shown as waveform (k) of FIG. 7 and noted as FF62($\overline{Q}$), is the 120 MHz output signal of the combinatorial logic 24 and appears on lead 25b.

The 100 MHz signal is generated by two divide-by-three counters 72 and 73 acting on different phases of a 20 MHz signal, and their outputs combined in a manner such as to create the signal with the desired waveform and phase. Referring to FIG. 6, the counter output signal 20 on lead 23h is applied to the D input of flip-flop 63 which is clocked by the ORed combination of the signal on the Q output of flip-flop 53 and the 320 MHz signal applied via lead 18. The resulting output signal, the Q output of flip-flop 63, which waveform is shown as waveform (1) of FIG. 7 and noted as FF63(Q), is a 20 MHz square wave and is applied to the D input of flip-flop 64. It acts as an enable to the divide-by-three counter 72 comprising flip-flops 64 and 65. This counter 72 is clocked by the 320 MHz signal via lead 18 and its output signal is derived from the $\overline{Q}$ output of flip-flop 64, which waveform is shown as waveform (m) of FIG. 7 and noted as FF64($\overline{Q}$). Waveform (n) of FIG. 7, noted as FF 65($\overline{Q}$), is the waveform at the $\overline{Q}$ output of flip-flop 65 and is useful in understanding the operation of the divide-by-three counter. Flip-flops 66 and 67 comprise a second divide-by-three counter 73 also clocked by the 320 MHz signal via lead 18, which acts on the first counter's 72 output signal, at the Q output of flip-flop 64, in a manner such as to produce a 100 MHz signal at the $\overline{Q}$ output of flip-flop 66. The waveform of this signal is shown as waveform (o) of FIG. 7 and noted as FF66($\overline{Q}$). The waveform of the signal at the $\overline{Q}$ output of flip-flop 67, useful in understanding the operation of the second divide-by-three counter 73, is shown as waveform (p) of FIG. 7 and noted as FF67($\overline{Q}$). Thus, the 100 MHz output signal of the combinatorial logic 24 is produced at the $\overline{Q}$ output of flip-flop 66 and appears on lead 25a.

The fourth, and final, output signal from the combinatorial logic is the one which frequency is 160 or 80 MHz, depending on the selection in the frequency select logic 31. Signal $\overline{S40}$, derived in the frequency select logic 31, is applied via lead 46 to the D input of flip-flop 68. It is at a low level in response to the selection of 40 MHz as the frequency of the output signal, and it is at a high level for any other selected frequency (and hence, for 80 MHz). Since the combinatorial logic 24 deals with signals having frequency twice the frequency selected for the output signal of the signal generator, the D input is low for an 80 MHz output signal from the circuitry comprising flip-flops 68, 69 and 70 and high for a 160 MHz output signal. Flip-flops 68 is clocked by the signal on the $\overline{Q}$ output of flip-flop 65, reflecting the state of the signal on the D input of flip-flop 68 onto one input of the OR gate enabling the D input of flip-flop 69. The signal on the other input of that OR gate is the counter output signal $\overline{80}$ on lead 23d. Flip-flop 69 is clocked by the counter 21 output signal $\overline{160}$ on lead 23b. When the frequency select signal applied via lead 46 to the D input of flip-flop 68 is low, the signal on the Q output of flip-flop 68 will also be low, and the signal on the $\overline{Q}$ output of flip-flop 69 will be a direct result of counter 21 output signal $\overline{80}$ applied via lead 23d. The waveform of the signal appearing on the $\overline{Q}$ output of flip-flop 69 is shown as waveform (q) of FIG. 7 and noted as FF69($\overline{Q}$) (SEL40). However, when the frequency select signal on lead 46 is high, the signal on the Q output of flip-flop 68 will be high and that high signal applied to the D input of flip-flop 69 will dominate the OR gate and the signal on the $\overline{Q}$ output of flip-flop 69 will be a constant low.

The signal on the $\overline{Q}$ output of flip-flop 69 is applied to the D input of flip-flop 70, in ORed combination with the counter 21 output signal $\overline{160}$ via lead 23b. Flip-flop 70 is clocked by the 320 MHz signal applied via lead 18. The two waveforms of the signals appearing on the $\overline{Q}$ output of flip-flop 70 are depicted as waveforms (r) and (s) of FIG. 7 and noted as FF70($\overline{Q}$) (SEL40) and FF70($\overline{Q}$) (SEL80), respectively. The former waveform results when the signal at the D input of flip-flop 68 via lead 46 is low; and latter waveform reflects a high signal at that input. The signal appearing at the $\overline{Q}$ output of flip-flop 70 is the 160/80 MHz output signal of the combinatorial logic 24 and appears on lead 28.

Although in the present embodiment the 160 MHz and 80 MHz signals are derived in the combinatorial logic 24 in order to impress them on a single lead 28, it would be obvious to one skilled in the art to couple the 160 and 80 counter output signals on leads 23a and 23c, respectively, directly to the gating circuit 29 to achieve the same result. Again, considerations of speed and symmetry have directed the applicant to the course described herein.

Figure 8:
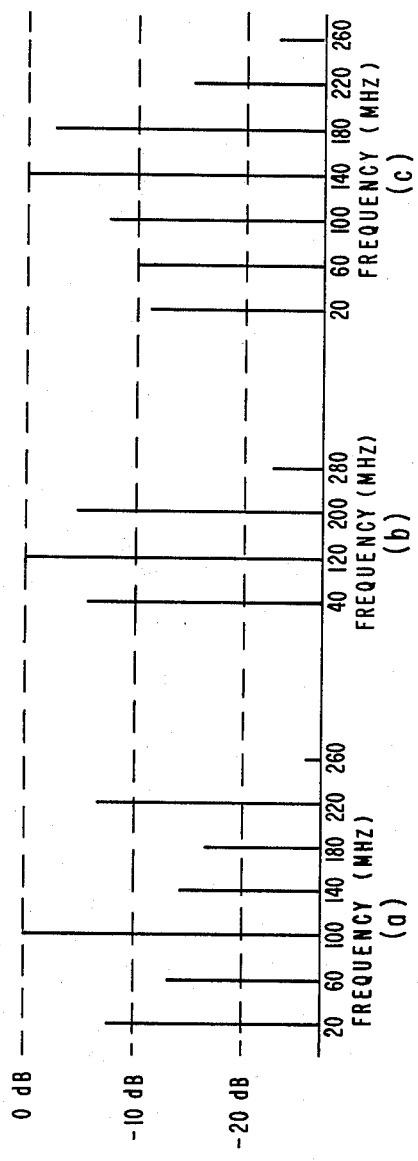
FIG. 8 is a set of graphical representations of the Fourier analyses of the combinatorial logic output signals.

A Fourier analysis of the waveforms of three of the combinatorial logic output signals, 100 MHz, 120 MHz and 140 MHz, at leads 25a, 25b and 25c, respectively, is depicted in FIG. 8. The spectral components of the 100 MHz output signal are shown in graph (a) of FIG. 8 referenced to the 100 MHz signal at 0 db. Similarly, graphs (b) and (c) of FIG. 8 show, respectively, the spectral components of the 120 Mhz and 140 MHz signals also referenced to 0 db. In general, it may be seen that sizable components of sideband frequencies exist in the combinatorial logic output signals, and the effect of bandpass filtering these signals will be seen in a subsequent figure.

Figure 9:
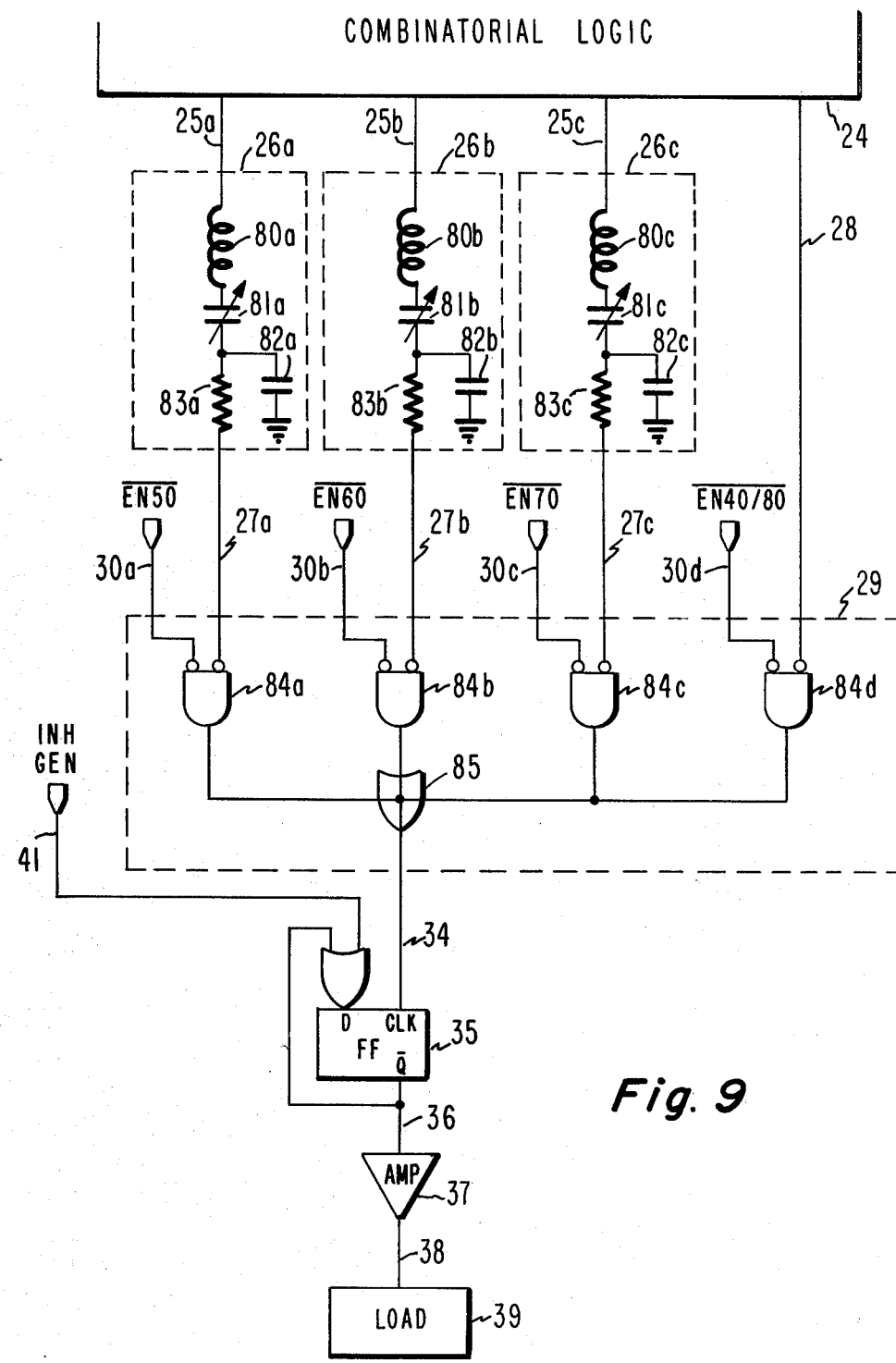
FIG. 9 is a circuit diagram of the bandpass filters, gating circuit, divider and amplifier of the embodiment of FIG. 3.

The three output signals from the combinatorial logic 24 which are not integral divisors of the clock signal 44, namely, signals 100 MHz, 120 MHz and 140 MHz, are applied via leads 25a, 25b and 25c, respectively, to three separate bandpass filters 26a, 26b and 26c, respectively, as shown in FIG. 9. Each of these filters includes a fixed inductance (inductor 80a, 80b or 80c) and a trimmer capacitance (capacitor 81a, 81b or 81c) so that the pass frequency may be tuned with precision. Table 1 below specifies the value of inductance L selected for each frequency, as well as the value of capacitance C to which each trimmer capacitor 81a, 81b and 81c must be tuned for optimum performance, using the formula $$2\pi f = 1/\sqrt{LC}\ .$$

Each trimmer capacitor 81a, 81b and 81c has a tunable range of 0.2 to 10 pf.

TABLE I

| Frequency | L | C |
| --- | --- | --- |
| 100 MHz | 0.50μH | 5.07pf |
| 120 MHz | 0.35μH | 5.03pf |
| 140 MHz | 0.25μH | 5.17pf |

Once the trimmer capacitors 81a, 81b and 81c have been set, capacitors 82a, 82b and 82c are selected so as to align the phase of the filter output signals on leads 27a, 27b and 27c such that the rising edges of all three signals are in coherence every 50 nanoseconds. Once capacitors 82a, 82b and 82c have been placed in the circuit, the trimmer capacitors 81a, 81b and 81c are re-adjusted to fine-tune the phase relationships. Resistors 83a, 83b and 83c are included to minimize ringing as part of normal ECL circuit design.

Figure 10:
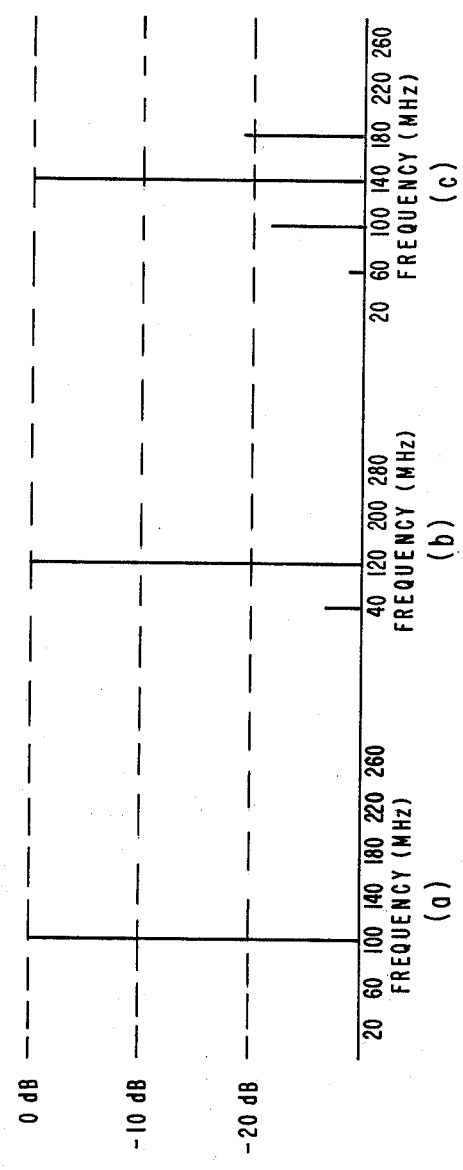
FIG. 10 is a set of graphical representations of the Fourier analyses of the filtered output signals, presented in the same scale as the spectral lines of FIG. 8 for direct comparison.

The effect of the filtering on the three combinatorial logic output signals, 100 MHz, 120 MHz and 140 MHz, on leads 27a, 27b and 27c, respectively, may be seen by contrasting FIG. 10 with FIG. 8. FIG. 10 represents the Fourier analysis of the filtered output signals. Graph (a) of FIG. 10 shows the spectral components of the 100 MHz signal referenced to the 100 MHz signal at 0 db. Similarly, graphs (b) and (c) of FIG. 10 show, respectively, the spectral components of the 120 MHz and 140 MHz signals also referenced to 0 db. Where no value line is shown in FIG. 10 for a given frequency, the amplitude of that component is more than 30 db below the pass frequency. FIGS. 8 and 10 are shown in proximity to facilitate comparison of the spectral components before and after filtering.

Figure 11:
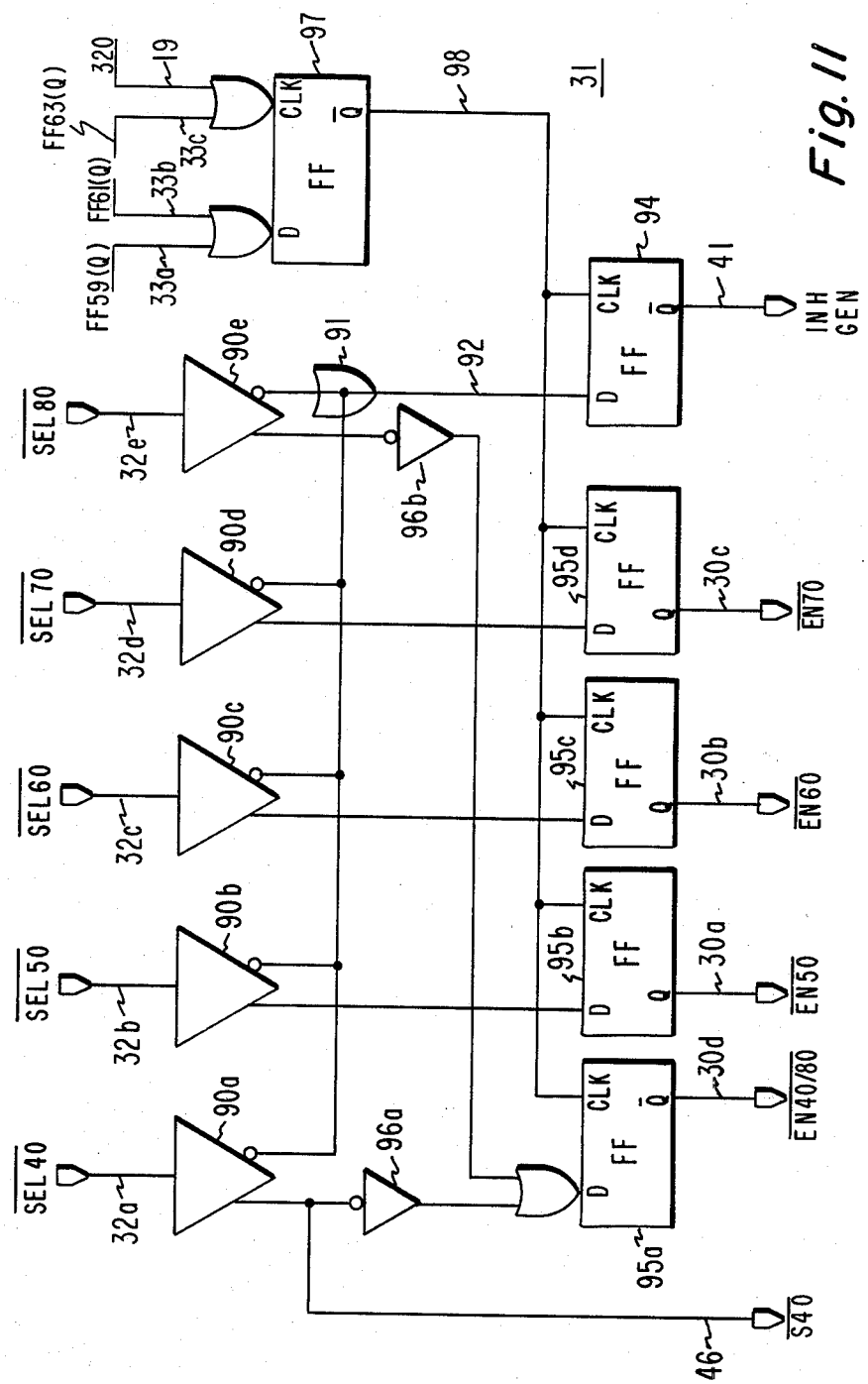
FIG. 11 is a logic diagram representation of the frequency select logic employed in the embodiment of FIG. 3.

The frequency select logic is depicted in FIG. 11. Five input signals, defining the selected frequency, are applied to the inputs of the five interface gates 90a, 90b, 90c, 90d and 90e, which are of a type similar to Motorola MECL MC10124 Quad MTTL to MECL gates. The five input signals represent the five different frequencies which the present embodiment of the instant invention was designed to provide on its output signal lead 38, as shown in FIG. 3. The five frequency select input signals on leads 32a, 32b, 32c, 32d and 32e are referred herein as $\overline{SEL40}$, $\overline{SEL50}$, $\overline{SEL60}$, $\overline{SEL70}$ and $\overline{SEL80}$, respectively. The five frequency select input signals can be selectively provided automatically by a process controlling device as, for example, a microprocessor or can be provided manually. According to the logic of the present embodiment, when the frequency select input signal is in a low logic level state, a corresponding frequency signal is provided at the generator output at lead 38. Only one of the five inputs should be in a low logic level state at one time. When all five inputs are in a high logic level state, the generator output signal at lead 38 is inhibited, as will be seen in subsequent discussions. In the present embodiment, which employs the MECL logic family, a low logic level state may be represented, for example, by −1.6 volts and a high logic level state may be represented by −0.8 volts.

Each of the interface gates 90a through 90e has two outputs, a normal, non-inverted output and an inverted output, the latter output represented by the bubble shown on each interface gate 90a through 90e on the logic diagram of FIG. 11. The five inverted outputs are interconnected in a wired OR 91 configuration having output lead 92. In the Emitter Coupled Logic family a wired OR configuration results in a high output signal when any one or more of the combined signals is at a high level. A low level output signal will be produced only if all of the combined signals are at a low level. In the present embodiment, if all five input signals $\overline{SEL40}$, $\overline{SEL50}$, $\overline{SEL60}$, $\overline{SEL70}$ and $\overline{SEL80}$ are high, the inverted output signals from gates 90a through 90e will all be low, and the output signal on lead 92 of the wired OR 91 will be low.

The wired OR signal at output lead 92 is applied to the D input of flip-flop 94 and when the signal at the D input is clocked into the flip-flop 94 via a rising edge of a signal on that flip-flop's CLK input, a signal of polarity opposite that at the D input will be present at the $\overline{Q}$ output. In terms of the five input signals $\overline{SEL40}$, $\overline{SEL50}$, $\overline{SEL60}$, $\overline{SEL70}$ and $\overline{SEL80}$, when one of them is low, the signal on the output lead 92 of the wired OR 91 combination will be high, and the signal on lead 41 connected to the $\overline{Q}$ output of flip-flop 94 will be low. But when all of the input signals $\overline{SEL40}$, $\overline{SEL50}$, $\overline{SEL60}$, $\overline{SEL70}$ and $\overline{SEL80}$ are high, the signal at the output lead 92 of the wired OR 91 combination will be a low, and the signal on lead 41 connected to the $\overline{Q}$ output of flip-flop 94 will be high. The signal at the $\overline{Q}$ output lead 41 of flip-flop 94 named INH GEN is applied to the divider 35 in a manner so as to inhibit the output signal on lead 38 of the generator when none of the select input signals on leads 32 is low.

The non-inverted output signals of the interface gates 90a, 90b, 90c, 90d and 90e are applied to the D inputs of flip-flops 95a, 95b, 95c and 95d. Because a single circuit within the combinatorial logic 24 is used to provide the 40 MHz and 80 MHz signal, a single enable lead 30d, and hence a single flip-flop 95a, is provided in the frequency select logic. The non-inverted output signals of 90a and 90e are applied to the inverting gates 96a and 96b, respectively, of a type similar to Motorola MECL III MC1662 Quad 2-input NOR gates. The signals at the outputs of these two inverting gates 96a and 96b are applied to the inputs of the OR gate which output is applied to the D input of flip-flop 95a. If either non-inverting output of interface gates 90a and 90b is low, the signal at the outputs of either inverting gates 96a and 96b will be high, and the OR function will place a high level on the D input of flip-flop 95a. When the signal at the D input of flip-flop 95a is clocked into the flip-flop via a rising edge of a signal on that flip-flop's CLK input, a signal of polarity opposite that at the D input will be present on lead 30d at the $\overline{Q}$ output. In terms of input signals $\overline{SEL40}$ and $\overline{SEL80}$, if either one of these two signals is low, the signal $\overline{EN40/80}$ on lead 30d at the $\overline{Q}$ output of flip-flop 95a will also be low.

The circuitry associated with input signals $\overline{SEL50}$, $\overline{SEL60}$ and $\overline{SEL70}$ is relatively more simple. When input signals $\overline{SEL50}$, $\overline{SEL60}$ and $\overline{SEL70}$ are low, the non-inverting outputs of interface gates 90b, 90c and 90d, respectively, are low, and hence the signals to the D inputs of flip-flops 95b, 95c and 95d, respectively, are low. When the signals at the D inputs of those flip-flops 95b, 95c and 95d are clocked into the flip-flops via a rising edge of a signal applied to the CLK inputs of those flip-flops, signals of the same polarity as those at the D inputs will be present at the Q outputs. In terms of input signals $\overline{SEL50}$, $\overline{SEL60}$ and $\overline{SEL70}$, if any one of these three signals is low, the corresponding signal $\overline{EN50}$, $\overline{EN60}$ or $\overline{EN70}$ appearing on lead 30a, 30b or 30c, respectively, connected at the Q output of flip-flop 95b, 95c or 95d, respectively, will also be low.

Signal S40, employed as a control signal in the combinatorial logic 24, is taken off the non-inverting output of interface gate 90a and is impressed on lead 46. $\overline{S40}$ is low when frequency select input signal $\overline{SEL40}$ on lead 32a is also low.

The signal at the $\overline{Q}$ output of flip-flop 97 is used to clock the other flip-flops 94, 95a, 95b, 95c and 95d in the frequency select logic 31 via lead 98. The signals at the inputs of the OR gate at the D input of flip-flop 97 comprise the signals at the Q outputs of flip-flops 59 and 61 (part of the combinatorial logic 24 described earlier), which are applied to the frequency select logic 31 via leads 33a and 33b, respectively. The signals at the inputs of the OR gate connected to the CLK input of flip-flop 97 comprise the signals at the Q output of flip-flop 63 (part of the combinatorial logic 24), connected via lead 33c, and the 320 MHz signal from the clock source 45 connected via lead 19.

The signal on lead 98 has a frequency of 20 MHz in this embodiment. This is the maximum frequency at which all of the filtered output signals on leads 27 and the combinatorial logic signals on lead 28 may be aligned in phase coherence. This results from the fact that 20 MHz is the greatest common divisor of the frequencies of the five signals carried on leads 27 and 28, namely, 80 MHz, 100 MHz, 120 MHz, 140 MHz and 160 MHz.

The gating circuit 29 depicted in FIG. 9 comprises four 2-input NOR gates, similar to MC1662 gates of the MECL III MC 1600 logic series. Gate 84a combines the output signal on lead 27a from the 100 MHz bandpass filter 26a with the 100 MHz enable signal $\overline{EN50}$ on lead 30a from the frequency select logic 31. When the enable signal $\overline{EN50}$ is at a logic low state, the filtered output signal appears (inverted) at the output of gate 84a. Gate 84b combines the signal on lead 27b from the 120 MHz bandpass filter 26b with the 120 MHz enable signal $\overline{EN60}$ on lead 30b from the frequency select logic 31. When enable signal $\overline{EN60}$ is at a logic low state, the filtered output signal appears (inverted) at the output of gate 84b. Gate 84c combines the signal on lead 27c from the 140 MHz bandpass filter 26c with the 140 MHz enable signal $\overline{EN70}$ on lead 30c from the frequency select logic 31. When the enable signal $\overline{EN70}$ is at a logic low state the filtered output signal appears (inverted) at the output of gate 84c. Gate 84d combines the 160/80 MHz signal on lead 28 from the combinatorial logic 24 with the 160/80 MHz enable signal $\overline{EN40/80}$ on lead 30d from the frequency select logic 31. When the enable signal $\overline{EN40/80}$ is at a logic low state, the combinatorial logic output signal appears (inverted) at the output of gate 84d. The outputs of these four gates, 84a, 84b, 84c and 84d, are interconnected in a wired OR 85 configuration, which results in a high output signal on lead 34 when any one or more of the combined signals is at a high level. A low level output signal will appear on lead 34 only when all of the combined signals are at a low level.

The gating circuit output signal on lead 34 is applied to the CLK input of the flip-flop of divider 35. The OR gate at the D input to that flip-flop 35 has as its input signals the signal at the $\overline{Q}$ output of flip-flop 35, to provide a divide-by-two effect each time the signal at the CLK input goes from a low to a high state, and a signal, INH GEN, connected via lead 41 from the frequency select logic 31 which inhibits the generator when there is no true signal from among the frequency select inputs on leads 32a, 32b, 32c, 32d and 32e, as shown in FIG. 11. This signal, INH GEN, which is applied to the OR gate, when in a high state, will prevent the flip-flop 35 outputs from toggling in response to the input signal on lead 34 at the CLK input of flip-flop 35. The normal (not inhibiting) condition for this input signal INH GEN is low.

The signal at the Q output of flip-flop 35 is a symmetrical waveform signal which frequency iss one-half that of the signal at its CLK input. Because the signal on lead 34 may be of frequencies 80, 100, 120, 140 and 160 MHz, the desired signal frequencies of 40, 50, 60, 70 and 80 MHz have thus been achieved. The signal at the $\overline{Q}$ output of flip-flop 35 may then be applied via lead 36 to a buffer amplifier 37, similar to Model No. UTO-523 of Avantek, Inc., of Santa Clara, California, operating class A, to provide a linear termination for any energy reflected on lead 38 back from the load 39. If such reflected energy is permitted to reach flip-flop 35, its non-linear output impedance could result in phase distortion and spurious harmonic generation. The amplifier 37 also provides power gain to raise the signal to the required level with reserve for adjustment.

FIG. 12 represents the waveforms of the combinatorial logic output signals before and after filtering, the 160/80 MHz output signal (which does not require filtering), and the output signal at the $\overline{Q}$ output of flip-flop 97 (as shown in FIG. 11) which controls the time at which frequency shifting takes place. Waveform (a) of FIG. 12 depicts the waveform of the 140 MHz output signal from the combinatorial logic 24 on lead 25c and waveform (b) of FIG. 12 shows that signal (squared) after filtering on lead 27c. Waveform (c) of FIG. 12 depicts the waveform of the 120 MHz output signal from the combinatorial logic 24 on lead 25b and waveform (d) of FIG. 12 shows that signal (squared) after filtering on lead 27b. Waveform (e) of FIG. 12 depicts the waveform of the 100 MHz output signal from the combinatorial logic 24 on lead 25a and waveform (f) of FIG. 12 shows that signal (squared) after filtering on lead 27a. Waveform (g) of FIG. 12 depicts the waveform of the 160/80 MHz output signal from the combinatorial logic 24 on lead 28 when the frequency is at 80 MHz, and waveform (h) of FIG. 12 shows that signal on lead 28 when the frequency is at 160 MHz. Waveform (i) of FIG. 12, noted as FF97($\overline{Q}$), represents the signal at the $\overline{Q}$ output of flip-flop 97, described earlier and depicted in FIG. 11, which clocks the frequency change flip-flops 95a, 95b, 95c, 95d and 95e, shown in FIG. 11.

All of the waveforms of FIG. 12 are shown in operational phase relationship; all of the signals to be applied to the inputs of the gating circuit 29 (in FIG. 9), those of waveforms (b), (d), (f), (g) and (h) of FIG. 12, have rising edges which are aligned with the rising edge of the frequency shift signal, FF97 ($\overline{Q}$), the signal at the $\overline{Q}$ output of flip-flop 97, shown in waveform (i) of FIG. 12. This ensures that all frequency shifts will occur at times when the signals applied to the inputs of the gating circuit 29 are in phase coherence.

One reason for carrying doubled frequencies beyond the point of frequency selection in the gating circuit is to ensure coherence of waveform direction at the time of frequency shifting. The doubled frequency signals will all have rising edges at the point of change of frequency select enables, and switching at this point ensures coherence of direction. In contrast, the prior art cited above, and depicted in FIG. 2, describes a system requiring a selective phase inverter at the output to accommodate differences in phase direction of the several input signals of different frequencies.

A second reason for providing a final division of the signal frequency is to improve the symmetry of the waveform. The filters 26 are tuned to provide phase coherence at periodic rising edges. Any lack of symmetry within each single cycle of a signal may be eliminated by causing each transition of the final output signal, both rising and falling edges, to occur only on the rising edges of the gating circuit output signal. Flip-flop 35 is clocked on the rising edge of the gating circuit output signal on lead 34 and hence, the symmetry of the signal appearing at the Q output of that flip-flop 35 and on lead 36 is enhanced.

One practical application of this invention is in binary code transmissions, widely used in digital communications, in which short period transmissions of an RF signal are alternated with short period transmissions of that signal with its phase shifted by 180°. If the phase reversal, or signal inversion, occurs abruptly, unwanted perturbations will be present disrupting the transmission. The instant invention provides a means for smoothly bridging the signal with its inverse.

A typical binary code transmission may involve an RF signal at 40 MHz being sent for periods of time which are integral multiples of 1.6 microseconds, alternating with the inverse of that signal at 40 MHz, also for periods of time which are integral multiples of 1.6 microseconds. The foregoing description of the instant invention has disclosed a signal generator which can shift frequency in phase coherence at 50 nanosecond intervals. If an RF signal operating at 40 MHz were coherently shifted to 50 MHz for one 50 nanosecond interval of time, then coherently shifted back to 40 MHz, it can be seen that during that 50 nanosecond period the 50 MHz signal would have coursed 2½ cycles. Hence, the return to the 40 MHz rate would result in a signal inverted in its relation with the earlier 40 MHz signal.

The 50 nanosecond burst of 50 MHz signal in this example represents, as a maximum, approximately 3% of the period of the total transmission and, in a Fourier analysis, does not even appear as each pair of occurrences are in phase opposition and have the effect of cancelling each other out.

What is claimed is:

1. An apparatus for providing in response to a clocking signal one of a plurality of symmetrical waveform signals at predetermined different frequencies selectable according to corresponding select input signals, said apparatus comprising:

counter means responsive to said clocking signal for producing a plurality of counter output signals having frequencies which are integral divisors of said clocking signal;

combinatorial means coupled to said counter means for combining said counter output signals in a manner to produce combinatorial output signals of a given integral multiple of said predetermined frequencies;

means including separate filters tuned to said integral multiple of said predetermined frequencies responsive to each of said combinatorial output signals for producing substantially symmetrical filtered output signals at said integral multiple of said predetermined frequencies and for aligning all of said filtered output signals in a manner to produce periodic instances of phase coherence of said filtered output signals;

said combinatorial means including means for producing timing signals related to said periodic instances of phase coherence;

switch means responsive to a selected one of said select input signals and responsive to said timing signal for producing a frequency select signal, whereby changes in said frequency select signal occur only at said instances of phase coherence of said filtered output signals;

means responsive to each said filtered output signal and responsive to said frequency select signal for gating said filtered output signal having the frequency which is said integral multiple of the predetermined frequency corresponding to said select input signal; and means for dividing said gated filtered output signal by said integral multiple to provide said symmetrical waveform signal at said predetermined frequency.

2. The apparatus as set forth in claim 1, wherein said counter means is a binary ripple-carry counter, and all of said integral divisors of said clocking signal result from successive binary divisions of said clocking signal.

3. The apparatus as set forth in claim 1, wherein said combinatorial means includes an exclusive-OR.

4. The apparatus as set forth in claim 1, wherein said separate filters include a series combination of an inductance L and a capacitance C tuned to pass frequency f of said combinatorial output signal according to $$2\pi f = \frac{1}{\sqrt{LC}}.$$

5. The apparatus as set forth in claim 1, wherein said means for producing timing signals includes means for producing a signal having frequency which is the greatest common integral divisor of said integral multiple of said predetermined frequencies.

6. The apparatus as set forth in claim 1, including a Class A amplifier coupled to said dividing means for providing output buffering and amplification of said symmetrical waveform signal from said dividing means.

7. The apparatus as set forth in claim 1, wherein said counter means produces one or more counter output signals having frequencies which are said integral multiple of said predetermined frequencies, and said gating means further includes means responsive to each of said one or more counter output signals and responsive to said frequency select signal for gating said counter output signal having frequency which is said integral multiple of the predetermined frequency corresponding to said select input signal.

* * * * *